(12) United States Patent
De Campo et al.

(10) Patent No.: US 12,163,997 B2
(45) Date of Patent: Dec. 10, 2024

(54) TESTING AN ELECTRONIC CIRCUIT HAVING A VOLTAGE MONITOR CIRCUIT

(71) Applicant: STMICROELECTRONICS S.r.l., Agrate Brianza (IT)

(72) Inventors: Nicola De Campo, Cura Carpignano (IT); Matteo Venturelli, Lonato del Garda (IT); Matteo Brivio, Cornate d'Adda (IT); Mauro Foppiani, Milan (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 159 days.

(21) Appl. No.: 18/151,330

(22) Filed: Jan. 6, 2023

(65) Prior Publication Data

US 2023/0228806 A1 Jul. 20, 2023

(30) Foreign Application Priority Data

Jan. 18, 2022 (IT) .......................... 102022000000683

(51) Int. Cl.
*G01R 31/28* (2006.01)
*G01R 19/00* (2006.01)

(52) U.S. Cl.
CPC ..... *G01R 31/2834* (2013.01); *G01R 19/0038* (2013.01); *G01R 31/2843* (2013.01)

(58) Field of Classification Search
CPC ............ G01R 31/2834; G01R 19/0038; G01R 31/2843; G01R 31/2882; G01R 35/00
USPC ....................................................... 324/762.01
See application file for complete search history.

(56) References Cited

U.S. PATENT DOCUMENTS

| | | | |
|---|---|---|---|
| 6,462,558 B1 | 10/2002 | Taurand | |
| 2009/0206864 A1* | 8/2009 | Gurevitch | H03M 1/109 324/750.3 |
| 2011/0074435 A1 | 3/2011 | Mizoguchi | |
| 2019/0107565 A1* | 4/2019 | Smythe | G01R 19/1659 |
| 2022/0329252 A1* | 10/2022 | Oreggia | H03M 1/1076 |

FOREIGN PATENT DOCUMENTS

EP 3396399 A1 10/2018

* cited by examiner

*Primary Examiner* — Raul J Rios Russo
(74) *Attorney, Agent, or Firm* — Seed IP Law Group LLP

(57) ABSTRACT

A system for testing is provided. The system includes an electronic circuit and an automatic testing equipment (ATE). The electronic circuit includes a voltage monitor including a resistive divider receiving at its voltage input an input voltage and coupled at its output to an input of a comparator. A reference input of the comparator is coupled to a generator supplying a reference voltage setting one or more thresholds of the comparator. The electronic circuit includes a Built In Self Test Module coupled to the ATE and to the inputs and output of the comparator. The BIST module is being configured upon receiving respective commands from the ATE to test a reaction time of the comparator and an offset of the comparator. The ATE performs a respective test of the ratio of the resistor divider by a first voltage measurement and a test of the reference voltage provided by the generator.

20 Claims, 12 Drawing Sheets

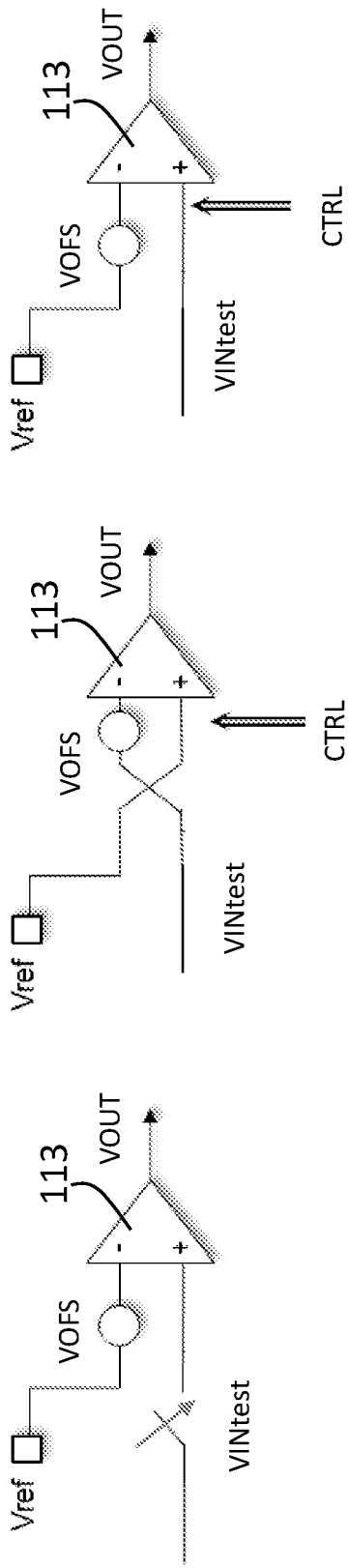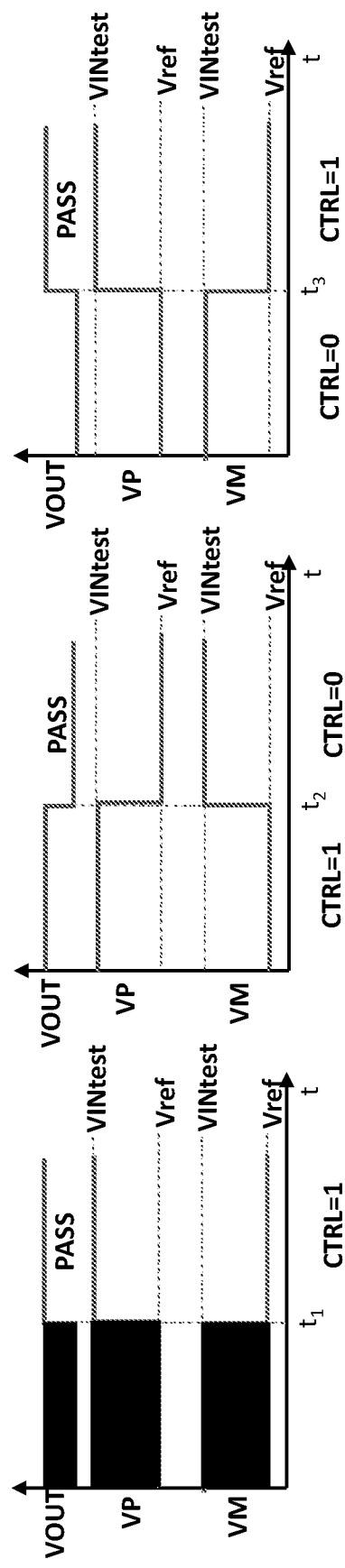

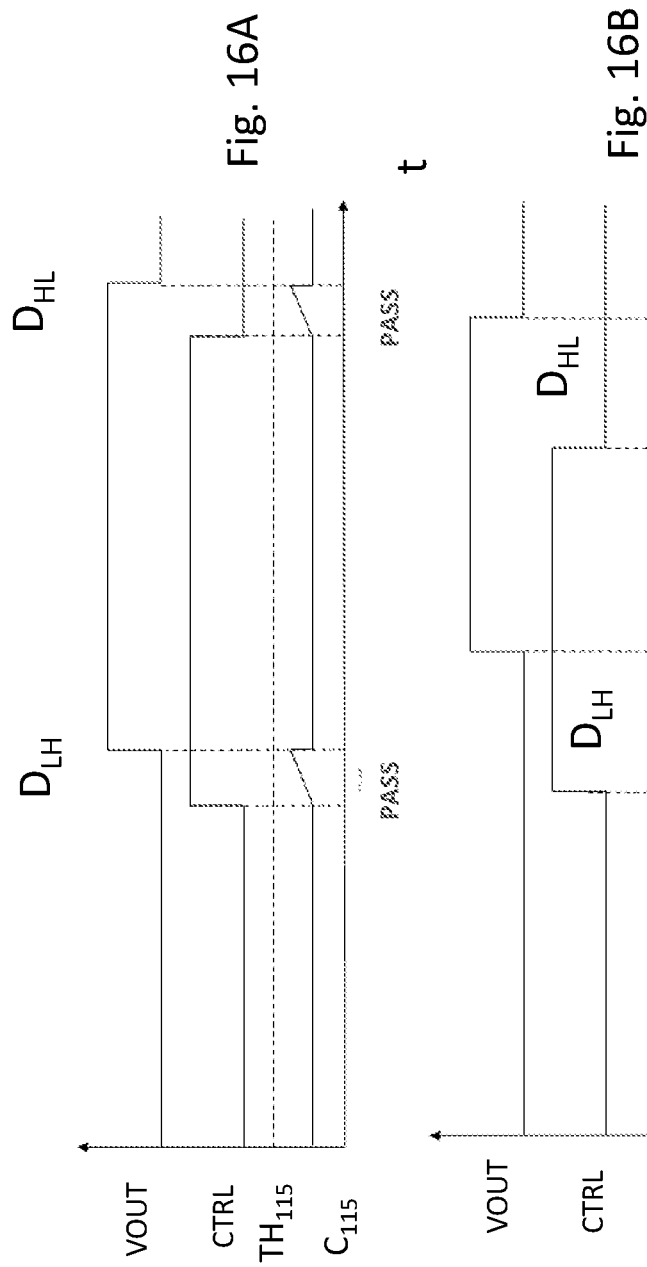

TESTING AN ELECTRONIC CIRCUIT HAVING A VOLTAGE MONITOR CIRCUIT

BACKGROUND

Technical Field

Embodiments of the present disclosure relate to techniques for testing electronic circuit, in particular an integrated circuit, comprising a voltage monitor circuit.

Embodiments of the present disclosure relate in particular to integrated circuits comprising a plurality of voltage monitors.

Description of the Related Art

The complexity of actual integrated circuit design and the consequent cost increase, due to test time related cost, forces to explore new methods of testing with the aim of simplifying test activity and improving efficiency.

The development of new technology nodes has led to the increase of design complexity (i.e., circuit with high level of configurability), more demanding quality requirements, with an increase of cost related to test time activities.

This cost could be reduced through an improvement of design architecture and testing methods.

Testing cost is one of the main components on the overall manufacturing cost of an integrated circuit. The increase of circuit configurability brings to a direct increase in the number of tests needed to cover all the possible configuration.

Among all the blocks present into a generic integrated circuit, voltage monitor is one of the most widely used, due to the need of monitoring continuously the value of several voltage sources. For instance, battery voltage, linear regulator output voltage, input/output supply voltage, buck/boost converter output voltage and so on.

A voltage monitor checks if a voltage (i.e., battery) crosses a threshold (i.e., overvoltage) and, after a reaction time, notify this condition to a microcontroller which makes a decision based on this alert.

The test of a voltage monitor consists in the measure of its thresholds and its reaction time.

Current products usually implement a large number of voltage monitors possibly with a large number of configurable thresholds in order to give a full set of on-chip diagnosis. All these configurations need to be tested, but the usual testing strategy is time consuming.

The reaction time is measured as the time needed by a voltage step on the input to propagate on the output. The connection/disconnection of an ATE (Automatic Test Equipment) instrumentation is expensive in term of test time and could generate issue on test program repeatability.

Thus, in known solution the reaction time is obtained by applying a step on the input voltage of the voltage monitor and measuring the propagation delay on its output voltage.

For each monitor the threshold is measured by applying a voltage ramp to the input and observing the value of the ramp when monitor toggles. Since the threshold changes if the ramp is increasing or decreasing, two ramps are necessary to measure the threshold value VTH_LH when crossing from low voltage VL to high voltage VH, e.g., low logic level or ground to high logic level or voltage supply level, when crossing from high to low VTH_HL and the voltage difference between such two thresholds (i.e., a hysteresis voltage VTH_hyst). The length of such ramps is proportional to the voltage threshold precision. Furthermore, the number of ramps has to be multiplied for each voltage threshold for every voltage monitor and thus the related test time grows exponentially in complex devices.

The test of monitor must be applied for each monitor and for each configuration, hence some steps and several ramps have to be generated from external sources. This approach has a relevant impact on device test time, thus increasing the related cost.

In FIG. 1 it is exemplified a test of the threshold in a time diagram, showing the input voltage VIN and the output voltage VOUT of a voltage monitor as a function of time.

Initially, the input voltage VIN is at low voltage level VL, as well as the output voltage VOUT.

As shown, a voltage ramp is first applied on the input voltage Vin. The value of the voltage input VIN at time $t_{LH}$ at which the output voltage VOUT toggles to high level is the low to high threshold VTH_LH. The input voltage VIN reaches the high voltage level VH and then a second, decreasing, voltage ramp, is applied as input voltage VIN, the value of the voltage input VIN at time $t_{HL}$ at which the output voltage VOUT toggles again to low level VL is the high to low threshold VTH_HL. In FIG. 1 is also indicated the voltage difference between such two thresholds, the hysteresis voltage VTH_hyst.

A voltage ramp requests a long test time to be performed, usually from 5 to 10 ms and must be repeated twice for each threshold, therefore in case of voltage monitors with multiple thresholds the impact on test time is relevant.

The length of ramp cannot be reduced because the reduction affects measure accuracy. Also, the voltage levels VL and VH, which are the start and stop voltages of the ramp, depend on the product specification and cannot be changed.

In FIG. 2 it is exemplified a test of the reaction time in a time diagram, showing the input voltage VIN and the output voltage VOUT of a voltage monitor as a function of time.

In this case, a voltage step from low to high voltage is applied as input voltage VIN at a first time $t_1$, the output voltage VOUT toggles correspondingly at a second time $t_2$ after a delay, a reaction time from low to high $D_{LH}$ being computed as difference of such two times. In the same way, then a voltage step from high to low voltage is applied as input voltage VIN at a third time $t_3$, the output voltage VOUT toggles correspondingly at fourth time $t_4$ after a delay, a reaction time from high to low DHL being computed as difference of such two times.

The reaction times $D_{LH}$ and $D_{HL}$ are measured by an ATE time measurement unit (TMU). Connection and disconnection of TMU requires the opening/closing of relay which has a typical duration of 2-3 ms and could influence measure repeatability.

In FIG. 3 it is shown by a simplified schematics of a test architecture 10 for testing the threshold of a voltage monitor 113.

The test architecture 10 comprises an electronic circuit to be tested, in the example an integrated circuit, 11 which includes at least the voltage monitor 110. Of course, an integrated circuit may include a great number of voltage monitors and also other circuitry dedicated to the main functions of the integrated circuit, which are not shown for simplicity in FIG. 3.

The voltage monitor 110, comprises a voltage divider 111 which is coupled between an input voltage VIN pin and an input of a comparator 113, which is schematized here as a differential amplifier, which receives at the other input a reference threshold VTH from a reference threshold generating circuit 112, which is coupled to ground GND, i.e., outputs a reference threshold voltage VTH referred to ground GND.

The test architecture 10 comprises an ATE 12, which includes a ramp generator 121 coupled to the input voltage VIN pin and a threshold detector 122 coupled to the output voltage VOUT pin of the electronic circuit 11, at which is brought the output voltage of the voltage monitor 113.

The voltage monitor 110 compares a reference threshold VTH with a voltage source, i.e., the input voltage VIN, in order to detect, after a reaction time, when the voltage source crosses such threshold. This detection, already described with reference to FIG. 1, is important to identify possible fault condition: for instance, overvoltage, undervoltage, short to ground, short to battery and so on.

In FIG. 4 it is shown by a simplified schematics a test architecture 10' for testing the reaction time of the voltage monitor 110.

In this case, the electronic circuit 11 to be tested is the same, while the ATE equipment 12 includes a step generator 123 coupled to the input pin VIN and a time measurement unit 124 coupled to the pin VOUT where the voltage monitor output is brought, in order to measure the reaction times $D_{LH}$ and $D_{HL}$ after the step generator 124 applies the voltage step as input voltage VIN.

In FIGS. 5 and 6 a possible implementation of the known solution of FIGS. 3 and 4 is shown.

The voltage monitor 113 is embodied by a comparator, i.e., a differential amplifier, which input is coupled to the center node of a configurable resistor divider 111, which comprises a high resistor RH coupled to the input voltage pin VIN at one terminal and to the center node to the other and a low resistor RL coupled to ground GND and to the center node to the other. In the ATE 12, a threshold calculation module 125 is shown which receives the ramp being applied from the ramp generator 121 and the output of a hysteresis comparator 122 embodying the threshold detector. The threshold calculation module 125 when the hysteresis comparator 122 toggles its output, acquires the value of the ramp as threshold value VTH_LH or VTH_HS, high to low or low to high according to the ramp used. At the end the module 125 may also be configured to compute the hysteresis voltage VTH_hyst.

A possible test for evaluating thresholds may include the following steps:
a) ATE 12 connects all its equipment, e.g., generator 121, detector 122, to the corresponding pins of the circuit 11;
b) increasing voltage ramp is applied on the pin VIN by the ATE 12 through the generator 121;
c) when VOUT toggles at time $t_{LH}$, VTH_LH is measured by the detector 122 as ramp value at time $t_{LH}$;
d) decreasing voltage ramp is applied on the pin VIN by the ATE 12 through the generator 121;
e) when VOUT toggles at time $t_{HL}$, VTH_HL is measured as ramp value at time $t_{HL}$.; Hysteresis voltage VTH_hyst is calculated as difference between VTH_LH and VTH_HL The use of ramps on voltage input VIN pin allows to verify both offset of comparator and threshold of the monitor voltage 11.

In the implementation of FIG. 6 electronic circuit 11 implementation correspond to the one of FIG. 5, while the ATE 12 comprises a step generator 123 and, as time measurement unit, a start stop counter 124 which receives as start signal the rising edge or respectively falling edge of the step provided by generator 13 and as stop signal the rising edge or respectively falling edge of the output voltage VOUT to compute reaction time from low to high DLH or reaction time from high to low $D_{HL}$.

A possible test for evaluating reaction time may include the following steps:
a) ATE 12 connects all its equipment, e.g., generator 123, TMU 124, to the corresponding pins of the circuit 11;
b) A voltage step is applied on the pin VIN by the ATE 12 from low voltage to high voltage;
c) Time measuring unit 124 count starts;
d) when output voltage VOUT toggles, Time measuring unit 124 count stops;
e) Reaction Time from low to high $D_{LH}$ is measured;
f) the same sequence is applied for VIN voltage step from high to low

BRIEF SUMMARY

According to one or more embodiments, provided is a circuit. Embodiments moreover concerns a related system as well as a corresponding method.

Provided is a system for testing comprising an electronic circuit to be tested and an automatic testing equipment, said electronic circuit to be tested comprising a voltage monitor to be tested comprising a resistive divider receiving at its voltage input an input voltage to be monitored and coupled at its output to an input of a comparator, a reference input of said comparator being coupled to a reference voltage generator supplying a reference voltage setting one or more thresholds of the comparator, wherein said electronic circuit to be tested comprises a Built In Self Test Module coupled to said Automatic Test Equipment and to the inputs and output of said comparator, said BIST module being configured upon receiving respective commands from the Automatic Test Equipment to test a reaction time of the comparator and an offset of the comparator, said Automatic Test Equipment comprising means for performing a respective test of the ratio of the resistor divider by a first voltage measurement of a voltage between an input of the divider and the output of the divider and a test of the reference voltage provided by the reference threshold generator by a second voltage measurement of the voltage applied by the reference threshold generator at the reference input node of the comparator.

In variant embodiments, said Built In Self Test Module comprises a logic module configured to issue command signals upon reception of said enabling signal
a swap circuit comprising two inputs and two outputs and an arrangement of switches configured to swap the coupling between its two outputs and its two inputs, at the outputs of said swap circuit being coupled the inputs of said comparator, at the inputs of said swap circuit being coupled the output of said divider and said reference threshold generator,
the output of said divider being coupled through a selection circuit, coupled at another its input to an offset generator coupled in series with the reference threshold generator and the reference input of the comparator, to said input of the swap circuit.

In variant embodiments, comprises a first voltmeter selectively connectable between the input of the divider and the output of the divider coupled to the voltage input of the comparator and a voltage generator connectable to the input of the divider, and
a second voltmeter selectively connectable at the reference input node of the comparator between the reference input of the comparator and ground.

In variant embodiments, the BIST module comprises a counter for measuring the reaction time, which start and stop signal input are coupled to the input and output of the comparator.

In variant embodiments, said Automatic Test Equipment comprises also a signal generator coupled to said a Built In Self Test Module to send a signal enabling said Built In Self Test Module to perform said reaction time test and said comparator offset test.

The present disclosure also provides solutions regarding an electronic circuit to be tested configured to operate in the system of any of the embodiments.

The present disclosure also provides solutions regarding a method for testing an electronic circuit to be tested using a system according to any of claims 1 to 5,
 comprising performing a test of a reaction time of the comparator and an offset of the comparator by the Built In Self Test Module coupled to said Automatic Test Equipment and to the inputs and output of said comparator, said BIST module being configured upon receiving respective commands from the Automatic Test Equipment,
 performing by said Automatic Test Equipment a respective test of the ratio of the resistor divider by a first voltage measurement of a voltage between an input of the divider and the output of the divider and a test of the reference voltage provided by the reference threshold generator by a second voltage measurement of the voltage applied by the reference threshold generator at the reference input node of the comparator.

In variant embodiments, said test of the reference threshold generator comprises the following steps:
 a) coupling the second voltage meter at the reference input node of the comparator;
 b) closing a test mode switch coupling the reference voltage to a test output of the electronic circuit to which the second voltage meter is coupled;
 c) reading by the second voltage meter the reference voltage value.

In variant embodiments, said test of the resistor divider comprises the following these steps:
 coupling the voltage generator to the divider input at the first voltmeter between the input of the divider and the output of the divider;
 supplying by the voltage supply generator an input voltage to the divider input;
 closing a test mode switch to couple the output node of the divider to the voltage supply generator;
 reading by the second voltage meter reading the difference between the input voltage and the voltage value on the output node of the divider;
 calculating a resistor divider ratio as the ratio of the input voltage to the voltage value on the output node of the divider.

In variant embodiments, said test of the offset of the comparator performs the following steps:
 coupling the signal generator to an input of a test mode logic module of the Built In Self Test module and an output a logic module of the Built In Self Test module to an input/output interface;
 generating by the signal generator a pulse to enable the start the test by the Built In Self Test module;
 setting a selection signal of the selection circuit by the test mode logic so that a test input voltage, sum of the reference voltage and of the offset voltage is brought at the voltage input of the comparator 113 and changing a swap control signal from low to high logic level, so that said test input voltage is coupled to the positive input and the reference voltage is coupled to the negative input of the comparator;
 checking if the output voltage is in high state, in affirmative the offset comparator being evaluated as lower than the offset voltage;
 after a delay, changing the swap control signal to low level to couple the test input voltage to the negative input and the reference voltage to the positive input voltage;
 checking if the output voltage is in low state, in affirmative the offset comparator being evaluated as lower than the offset voltage;
 determining the test result as passed if all the checks are affirmative, otherwise considering the test as failed;
 sending the test result by the BIST module to the ATE through the input/output interface.

In variant embodiments, said test of the reaction time of the comparator performs the following steps:
 coupling the signal generator to an input of a test mode logic module of the Built In Self Test module and an output a logic module of the Built In Self Test module to an input/output interface;
 generating by the signal generator a pulse to enable the start the test by the Built In Self Test module;
 setting a selection signal of the selection circuit by the test mode logic so that a test input voltage, sum of the reference voltage and of the offset voltage is brought at the voltage input of the comparator 113;
 resetting the counter, which receives the control signal as start signal and the output voltage as stop signal of the count operation;
 setting the swap control signal from low to high level, starting the count in the counter and determining the output voltage to change its state after a propagation delay reaction time, stopping the count of counter;
 measuring a reaction time low to high as propagation delay between the swap control signal changing from low to high level and the output voltage changing its output state accordingly;
 saving the measured value of reaction time low to high in the BIST module, resetting the counter;
 setting the swap control signal from high to low level, (starting the count in the counter and determining the output voltage to change its state after a propagation delay reaction time, stopping the count of counter;
 measuring a reaction time high to low as propagation delay between the swap control signal changing from high to low level and the output voltage changing its output state accordingly;
 saving the measured value of reaction time high to low in the BIST module;
 evaluating at the BIST module said reaction time saved values with respect to pass/fail criteria, producing a test result indicating a pass or a fail;
 sending the test result through the input/output interface to the Automatic Test Equipment.

The present disclosure also provides solutions regarding a computer program product that can be loaded into the memory of at least one computer and comprises parts of software code that are able to execute the steps of the method according to any of the previous embodiments when the product is run on at least one computer.

BRIEF DESCRIPTION OF THE SEVERAL VIEWS OF THE DRAWINGS

Embodiments of the present disclosure will now be described with reference to the annexed drawings, which are provided purely by way of non-limiting example and in which:

FIGS. 11A, 11B, 11C show a simplified schematics of the system of FIG. 10 in different phases of a configuration operation;

FIGS. 12A, 12B, 12C and 13A, 13B, 13C show time diagram of voltages of the system of testing in different phases of a configuration operation;

FIGS. 15A, 15B, 15C and 16A and 16B show time diagram of voltages of the system of testing in different phases of the further configuration of operation.

DETAILED DESCRIPTION

In the following description, numerous specific details are given to provide a thorough understanding of embodiments. The embodiments can be practiced without one or several specific details, or with other methods, components, materials, etc. In other instances, well-known structures, materials, or operations are not shown or described in detail to avoid obscuring aspects of the embodiments.

Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Figures parts, elements or components which have already been described with reference to FIGS. 1 to 6 are denoted by the same references previously used in such Figures; the description of such previously described elements will not be repeated in the following in order not to overburden the present detailed description.

The solution here described provides testing of voltage monitor by decomposing the architecture into its essential building blocks where each block can be tested separately. Once all the blocks and the relation between them (i.e., the connections) are tested, then voltage monitor functionality and parameters are completely tested.

Figure 1:
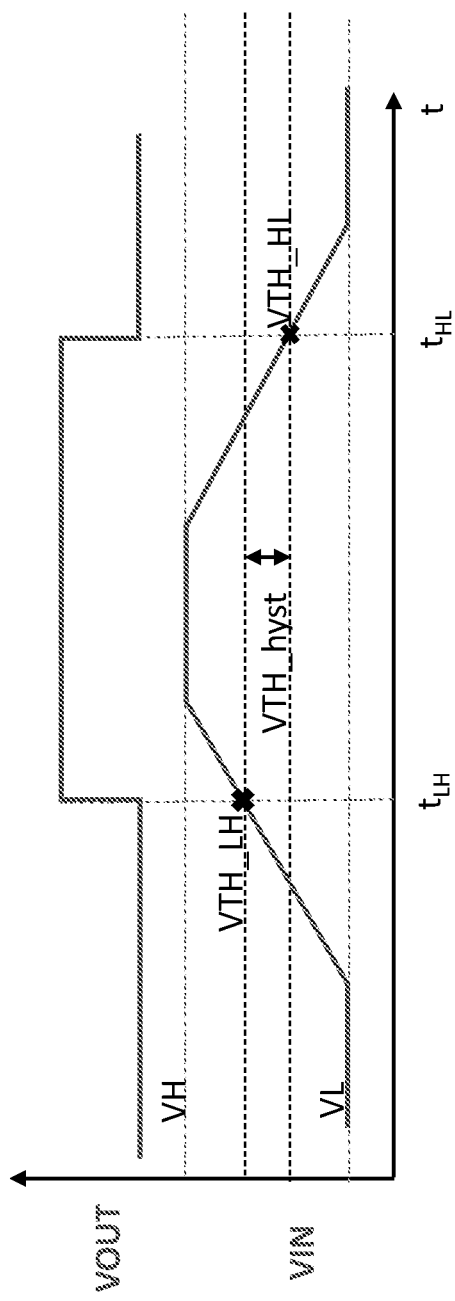
FIG. 1 shows a time diagram of a test of a threshold.
Figure 2:
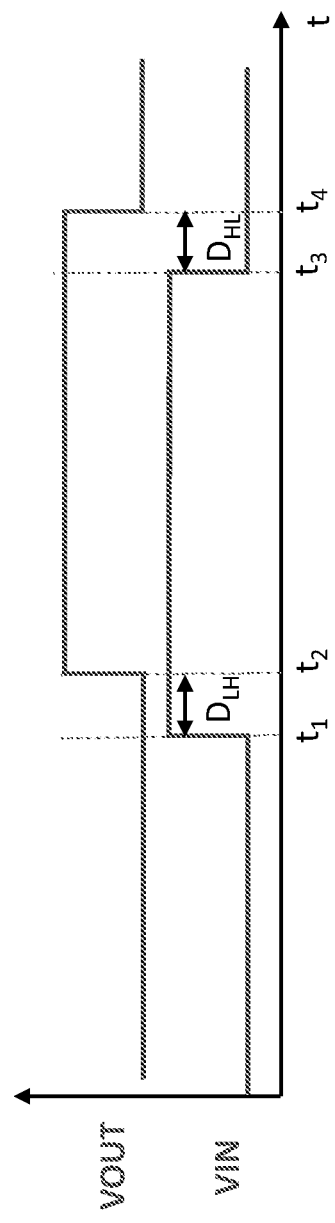
FIG. 2 shows a time diagram of a test of a reaction time.
Figure 3:
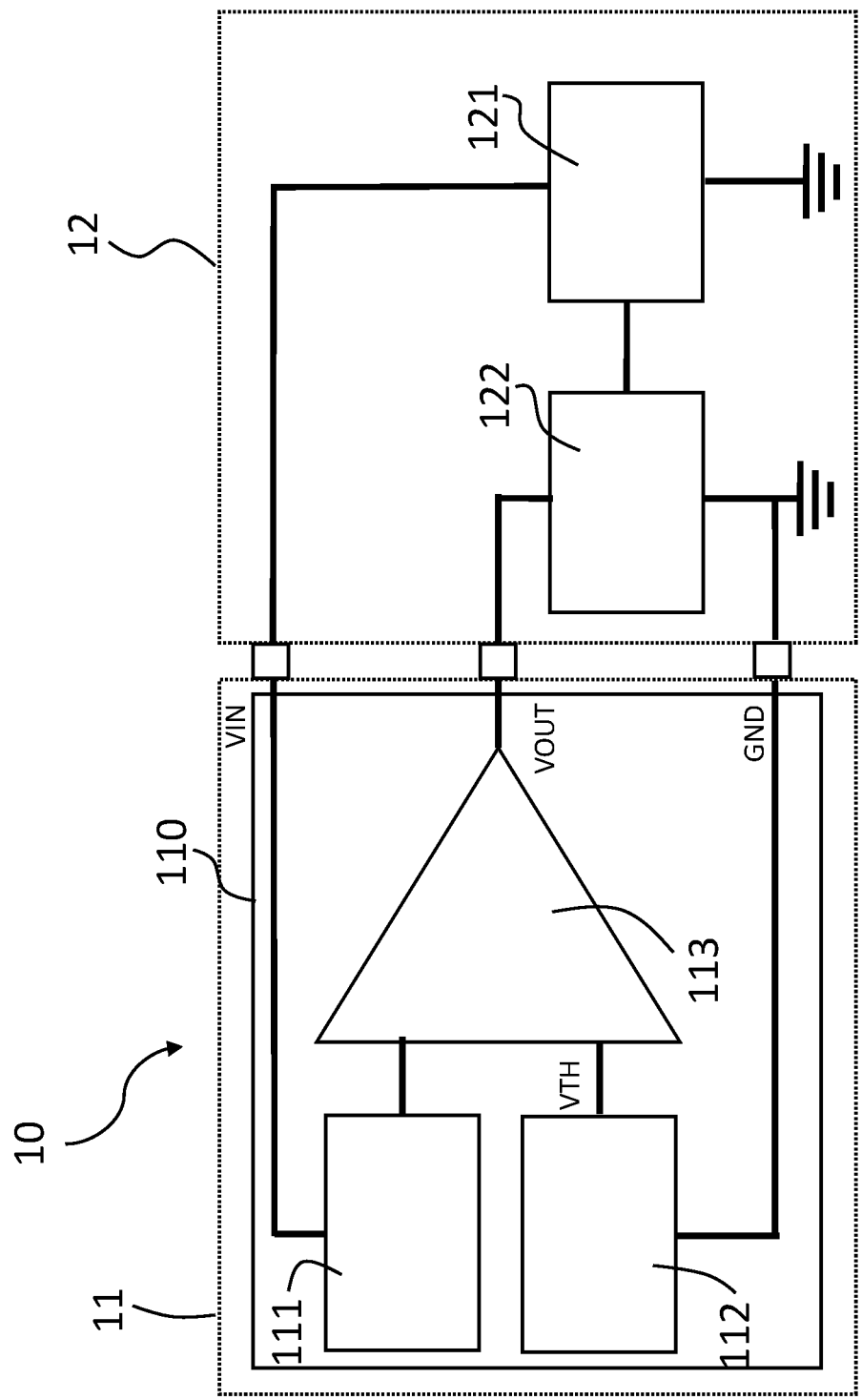
FIG. 3 shows a test architecture for testing a threshold of a voltage monitor.
Figure 4:
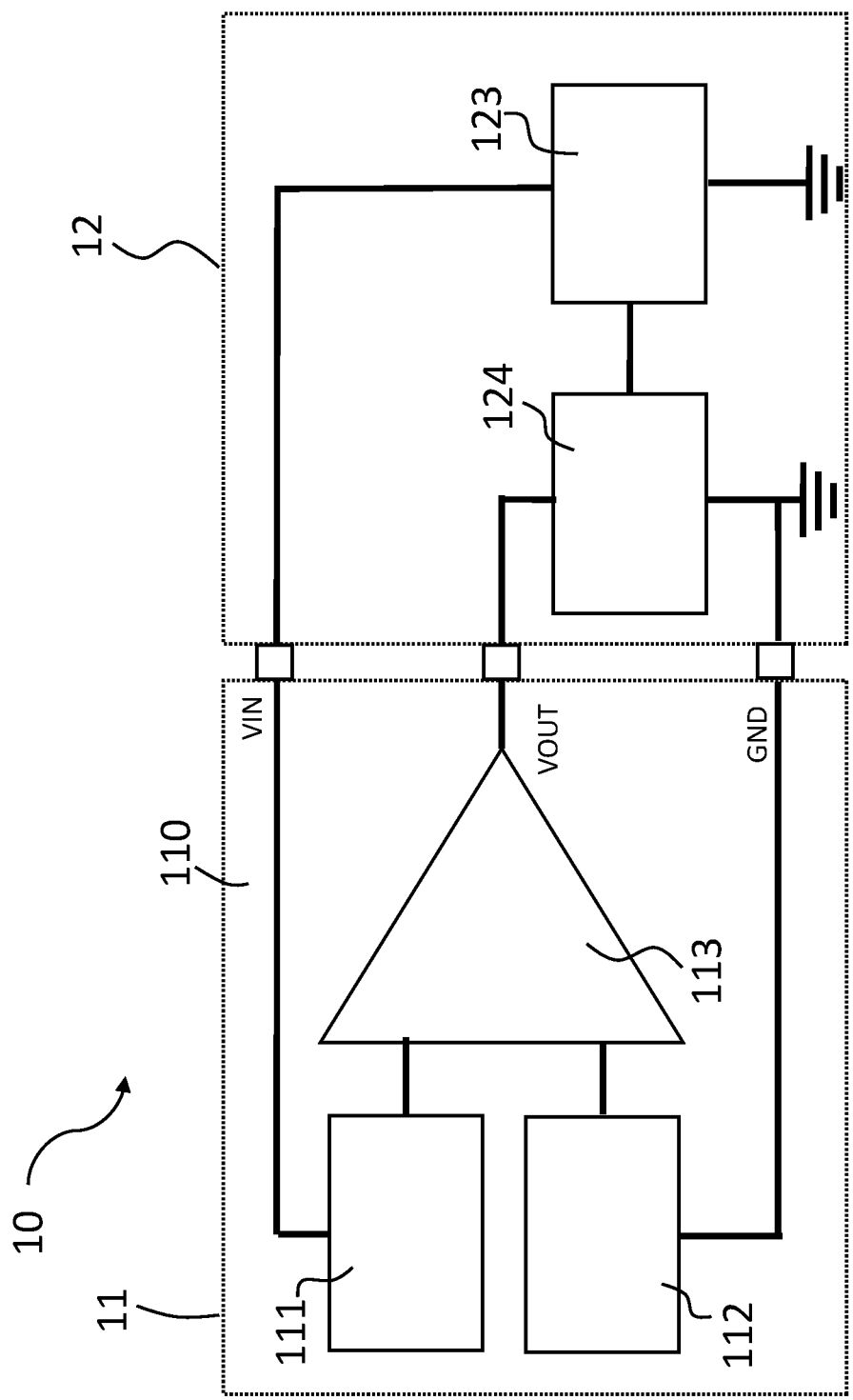
FIG. 4 shows a test architecture for testing a reaction time of the voltage monitor.
Figures 5, 6:
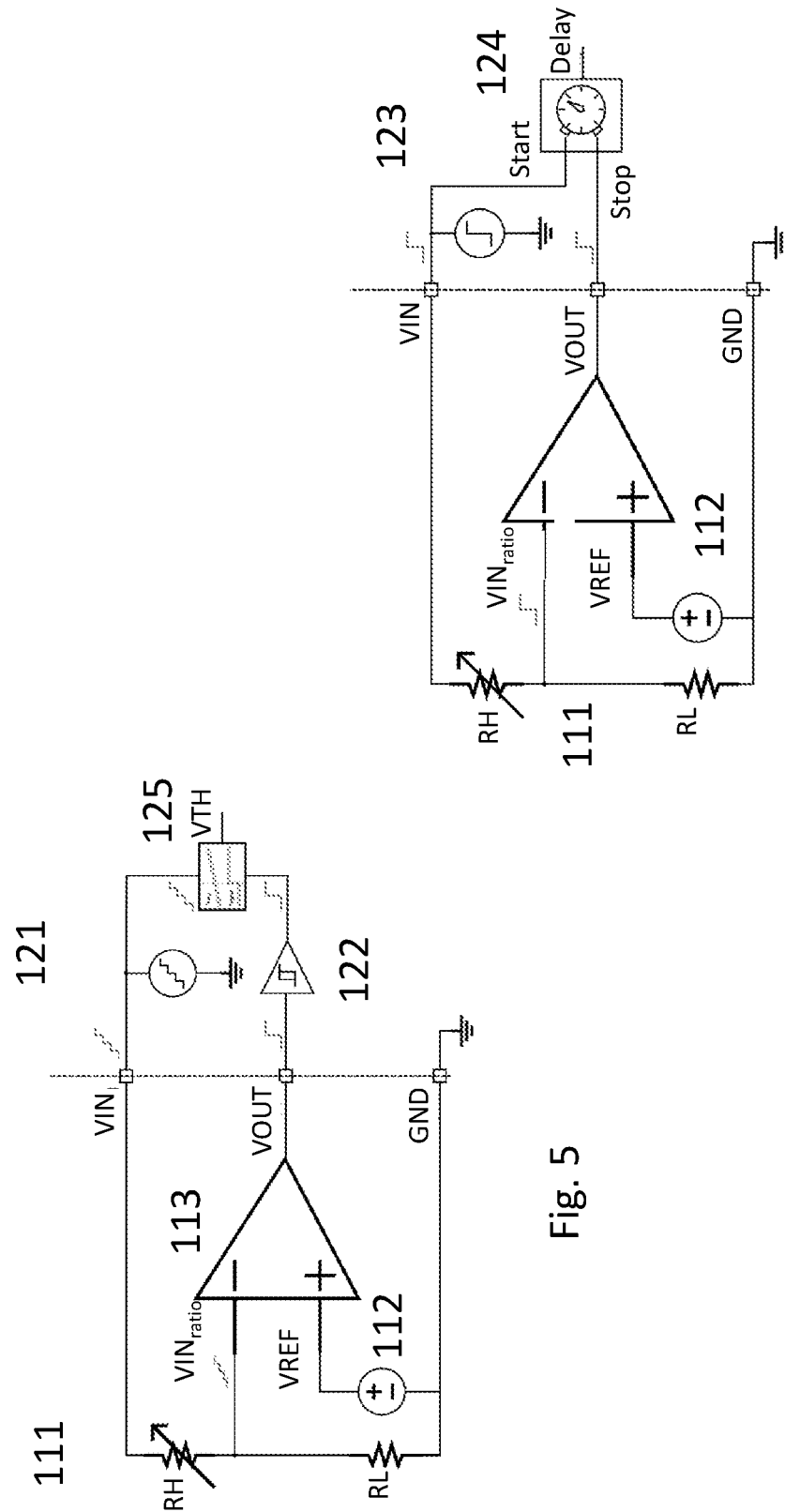
FIG. 5 shows a test architecture for testing the threshold of the voltage monitor.
FIG. 6 shows a test architecture for testing the reaction time of the voltage monitor.

As shown with references to FIGS. 3 and 4, components or blocks of a voltage monitor 110 are the comparator 113, a reference threshold generator 112 and a divider 111 of the input voltage. These main blocks are tested independently, substantially:

a) test the comparator 113 means to characterize its offset and reaction time;

b) reference threshold generator 112 test consists in a voltage meter measure.

c) divider 111 test is performed by a voltage meter measure.

Figure 7:
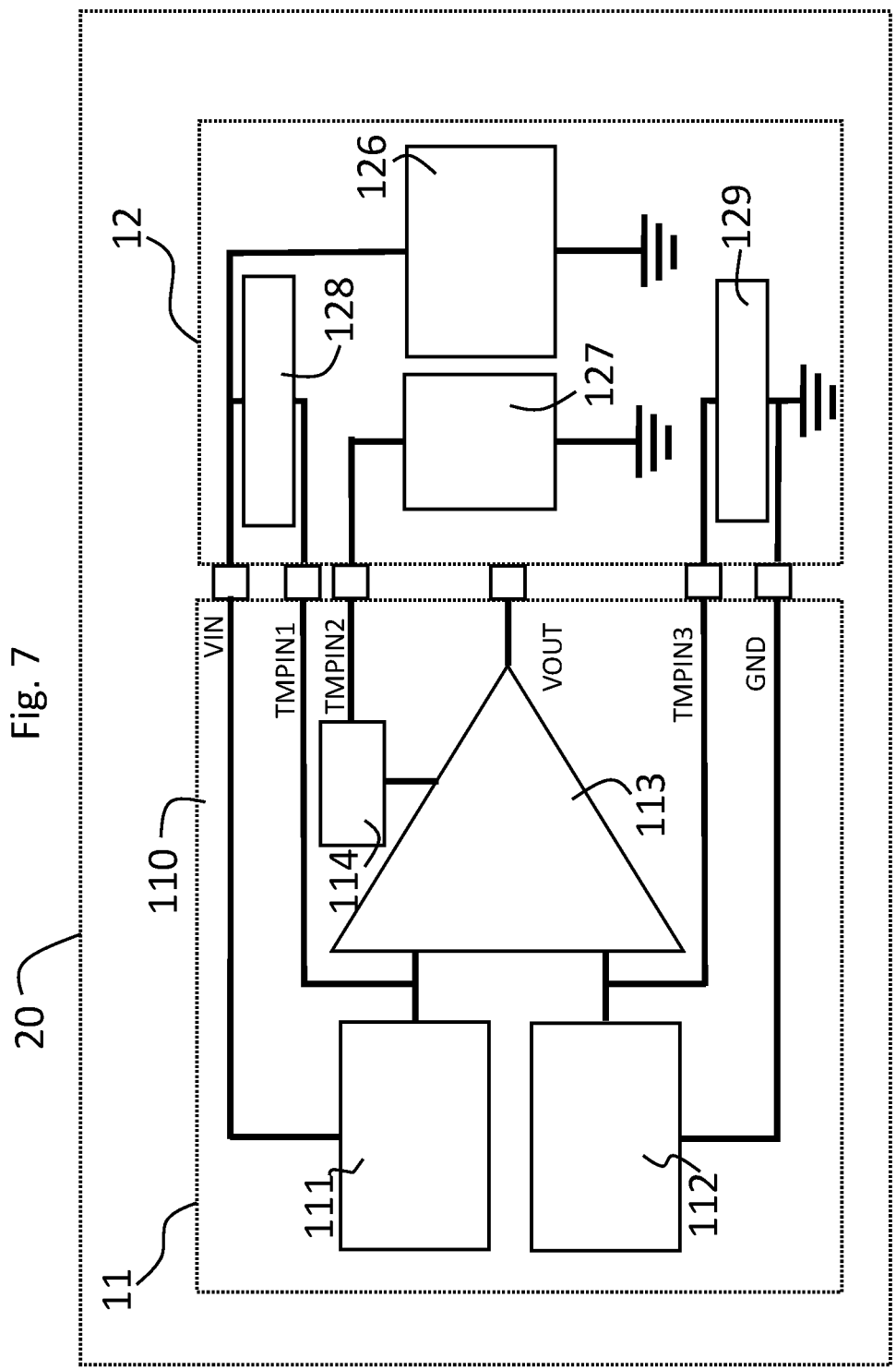
FIG. 7 shows schematically a system for testing according to a solution here described in a first configuration of operation.

In FIG. 7 it is shown a simplified schematics of an architecture 20 for testing an electronic circuit comprising a voltage monitor 110.

In the architecture 20 the electronic circuit 11 further to the voltage monitor 110, which is arranged like in FIG. 3 or 4, comprises a BIST (Built Self Test Module) 114 and a first test input pin TMPIN1, a second test input pin TMPIN2, and an output test pin TMPIN3. The first test TMPIN1 is coupled to the input of the comparator 113 and to the output of the divider 111. The second test pin 112 is coupled to the BIST module 114, which is in turn coupled to the comparator 113, specifically to its input and to its output as better shown in the following. The test output pin TMPIN3 is coupled to the other input of the comparator 113, i.e., to the output of the threshold reference generator 112.

The ATE 12 in its turn comprises a power supply generator 126 coupled to the input voltage VIN pin, then a first voltage meter 128 is coupled between the input voltage VIN pin and the first input test pin TMPIN1. The ATE 12 then comprises a signal generator 127 which output is coupled to the second test pint TMPIN2. Then, the ATE 12 further comprises a second voltage meter 129 which is coupled between the output test pin TMPIN3 and ground GND.

The architecture 20 is configured to perform a threshold test, in which each block 111, 112, of the voltage monitor 110 is tested separately from the others.

The divider 111 is tested using the first voltage meter 128.

The reference threshold generator 112 is tested using the second voltage meter 129.

The offset of the comparator 113 is tested using the BIST module 114 which is enabled through a signal received by the ATE 12 through the second input test TMPIN2, in particular generated by the signal generator 127.

Figure 8:
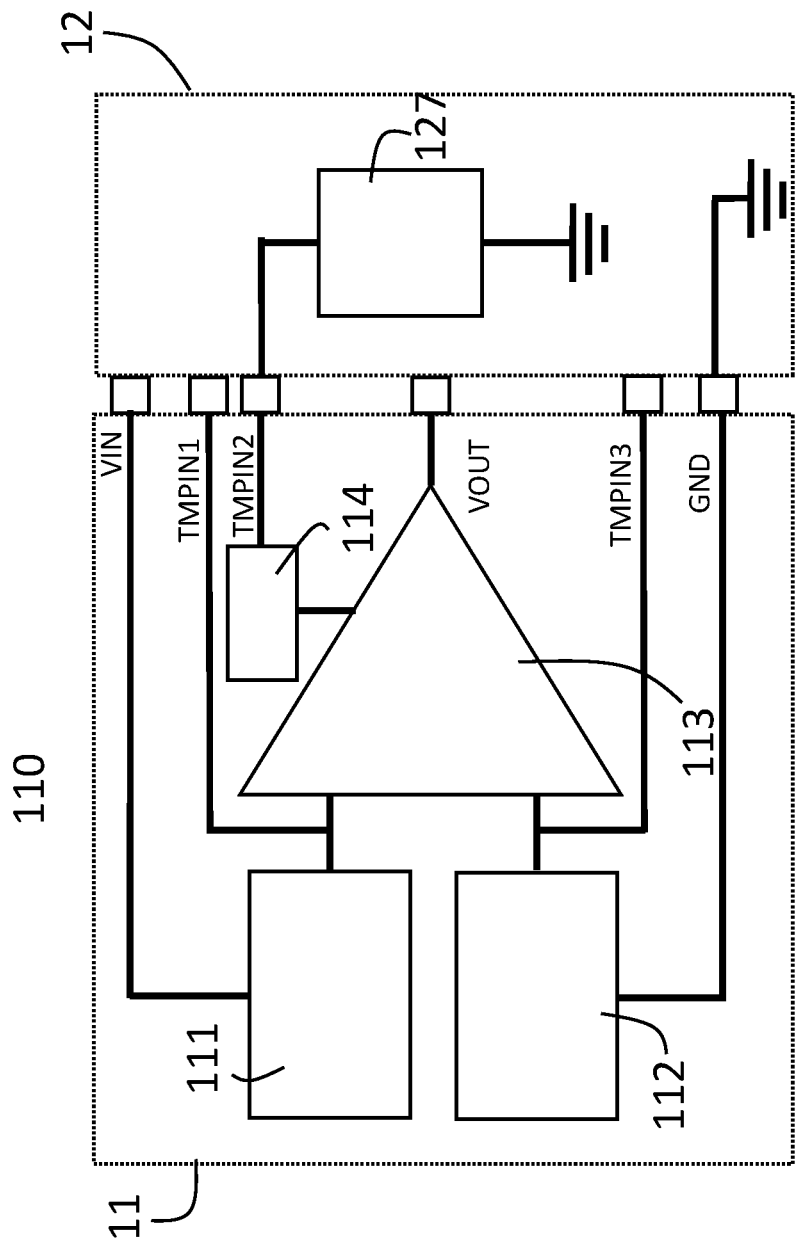
FIG. 8 shows schematically the system for testing of FIG. 7 on second configuration of operation.

In FIG. 8 it is shown a configuration of the architecture 20 for testing reaction time of an electronic circuit comprising a voltage monitor 110.

In this case only the electronic circuit 11 corresponds to the one of FIG. 7, while only the signal generator 127 is shown in the ATE 12. In general the other modules 126, 128, 129 may be present but inactive when testing the reaction time.

The architecture 20 in the configuration of FIG. 7 is configured to perform a reaction time test, in which each block 111, 112, 113 of the voltage monitor 110 is tested separately from the others.

The reaction time of comparator 113 is measured with the BIST module 114, internally to the electronic circuit 11, which is enabled through a signal received by the ATE 12 through the second input test TMPIN2, generated by the signal generator 127.

Figure 9:
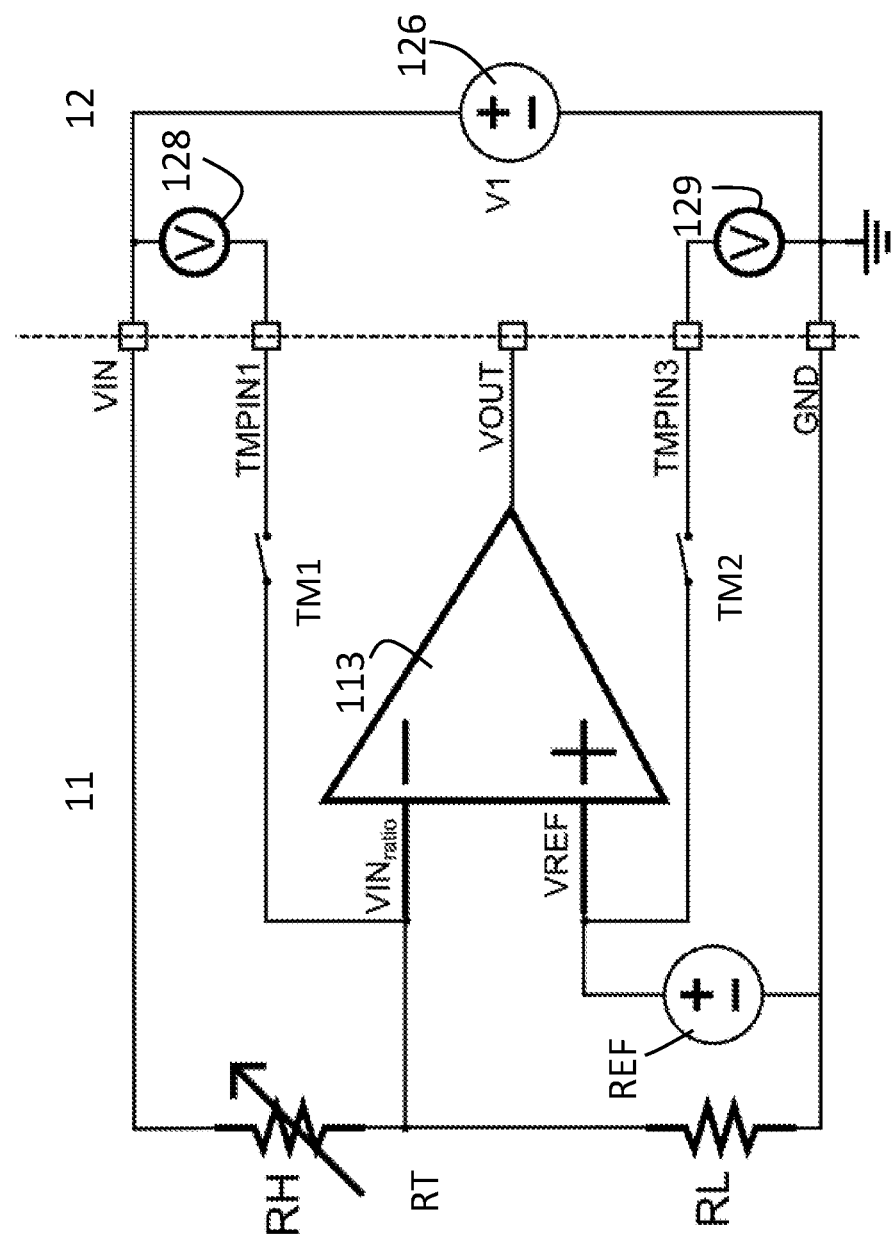
FIGS. 9 and 10 shows implementing details of the system of FIG. 7 in different configurations of operation.

In FIG. 9 it is shown a more detailed implementation of the architecture 20, with only the components of the ATE 12 which perform the threshold test for the divider 111 and the 112.

The testmode switches are arranged internally to the integrated circuit and are controlled by ATE through a communication interface (not shown in FIG. 9).

A first test mode switch TM1 is shown which selectively couples the second test input TMPIN2 with the comparator 113 input. Then a second test mode switch TM2 is shown, which selectively couples test output TMPIN3 with the comparator 113 reference input.

In the ATE 12 are shown the modules which are used in the threshold test, i.e., the voltage supply generator 126, the first voltage meter 128 and the second voltage meter 129.

The reference threshold generator 112 generates a reference voltage VREF internally into the electronic circuit 11. For instance, a bandgap voltage generator or another generator of voltage stable with temperature may be used.

The divider 111, as already described, includes a two resistors RH, RL, where the ratio between them is configurable.

The test of the reference threshold generator 112 and of its reference voltage VREF follows these steps:
  a) ATE 12 couples all the relevant modules, to the corresponding pins of electronic circuit 11. For instance, is coupled at least the second voltage meter 129;
  b) the second test mode switch TM2 is closed and the reference voltage VREF is coupled to the test output TMPIN3;
  c) the second voltage meter 129 reads the reference voltage VREF is value.

The test of the resistor divider 111 ratio follows these steps:
  a) ATE 12 couples all the relevant modules, to the corresponding pins of electronic circuit 11, e.g., at least modules 126, 129;
  b) the voltage supply generator 126 supply an input voltage on the VIN pin;
  c) the first test mode switch TM1 is closed and a center node of the divider 111, on which is a divided voltage VINratio, is coupled to the first test input TMPIN1;
  d) the first voltage meter 128 reads the difference between the input voltage VIN and the voltage value on the first test input TMPIN1;
  e) resistor divider ratio is calculated as $$\alpha = \frac{RH + RL}{RL} = \frac{VIN}{VIN_{ratio}},$$

where the input voltage Vin is known as it is forced by the generator 126 and the divided voltage VINratio is measured by the first voltage meter 128.

Since the voltage meter measure takes less than 1 ms, compared to ramp generator, the two tests for the divider and the threshold reference generator just shown reduce greatly test duration.

Figure 10:
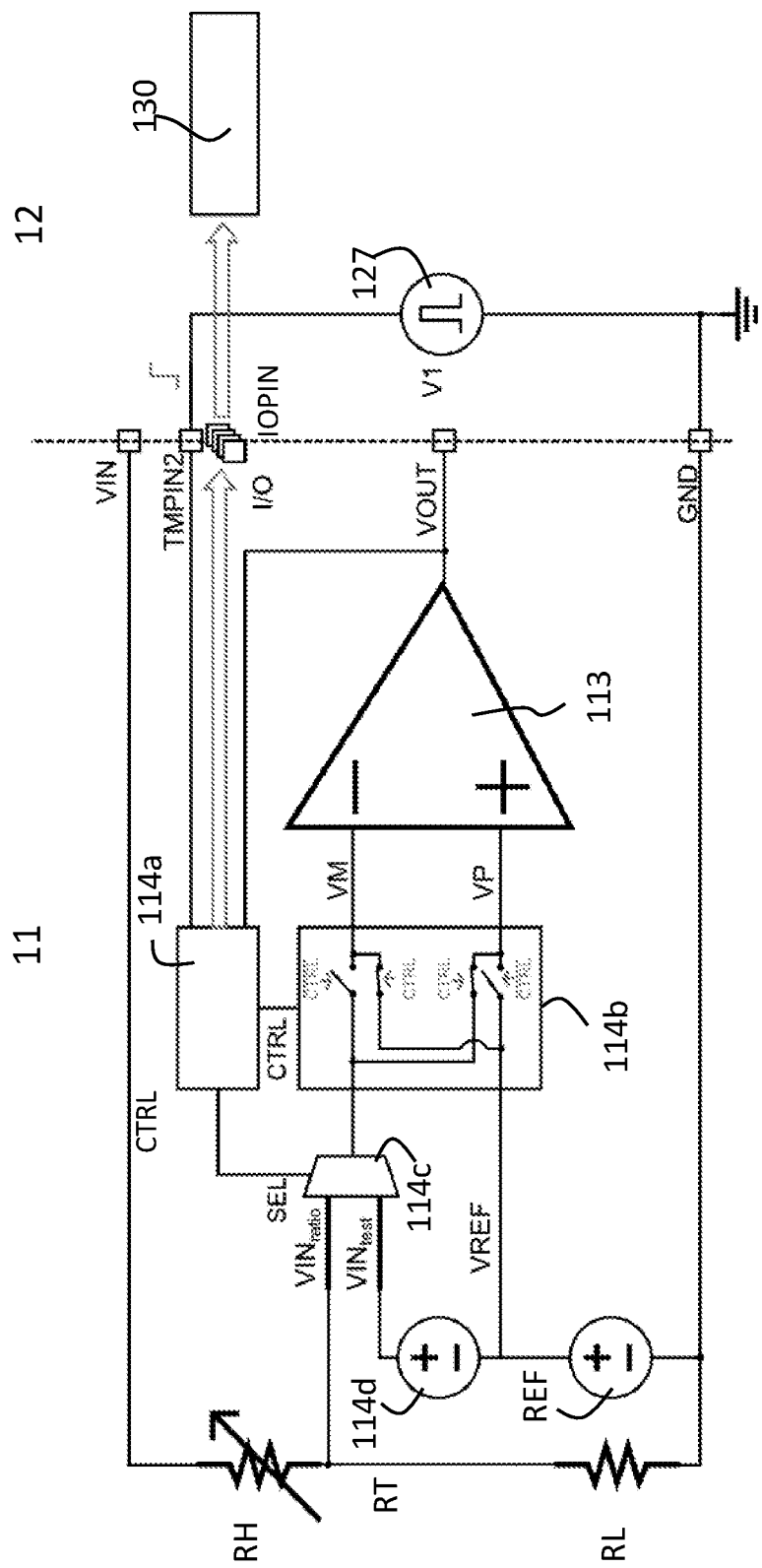

In FIG. 10 it is shown a more detailed implementation of the architecture 20, with only the components of the ATE 12 which perform the threshold test for the comparator offset.

In this case the electronic circuit 11 comprises in the BIST module 114 a test mode logic 114a, which receives an enable signal EN from the signal generator 127 of the ATE 12. A test switch set 114b receives from the test mode logic 114a a control signal CTRL. The test mode logic 114a also provides a selection signal SEL to a multiplexer 114c, which receives as input the divided voltage VINratio from the center output node of the divider 111 and a test input voltage VINtest, which is determined by an offset voltage generator 114d generating an offset voltage VOFSMAX, coupled between the reference input node of the comparator 113 and the input of the multiplexer 114d. Thus, the test voltage VIN test is equal to VREF+VOFSMAX.

The output of the multiplexer 114c and the reference node on which the reference voltage VREF is formed are the input of the switch network 114b. The switch network on each input interposes a couple of switches driven by the swap control signal CTRL and its negated. One of the switches, controlled by the control signal CTRL, couples the respective network 114b input with one input of the comparator 113, the other, controlled by the negated of the control signal CTRL, $\overline{CTRL}$, couples such respective network 114b input with the other input of the comparator 113, which are labelled as VM (inverting input) and VP (non-inverting input). Thus, if the swap control signal CTRL is asserted (the swap control signal CTRL is high or equal to a logic one), the output of the multiplexer 114c is coupled to the non-inverting input and the reference node is coupled to the inverting input, or reference input, of the comparator 113. If the negated of the swap control signal CTRL is asserted (the swap control signal CTRL is low or equal to a logic zero), the coupling of the network 114b inputs to the comparator 113 inputs is swapped.

The test mode logic 114a also comprises a data line, which through an input/output pin or pad IOPIN sends data to an input/output interface 130 in the ATE12.

The test mode logic 114a also is coupled to the output of the comparator 113 to measure the output voltage VOUT, i.e., the comparator state.

The test of the comparator 113 offset follows these steps, which are performed by the BIST module 114:
  a) ATE 12 couples all the relevant modules, to the corresponding pins of electronic circuit 11, in particular at least the signal generator 127 and the input output interface 30;
  b) the signal generator 127 generates a pulse on the second test input TMPIN2 to start the test;
  c) the testmode logic 114a controls the state of signals SEL, CTRL and reads the state VOUT of the comparator 113;
  d) the selection SEL is set by the test mode logic 114a so that the test input voltage VINtest, equal to VREF+VOFSMAX and created internally in the circuit 11 is brought at the inverting input VM of the comparator 113 when the swap control signal CTRL is low or equal to a logic zero; the swap control signal CTRL is changed from low to high logic level, so that the test input voltage VINtest is coupled to positive or non inverting input VP and the reference voltage VREF is coupled to the inverting or negative input VM.
  e) the comparator 113 toggles its output Vout;
  f) since comparator offset is lower than the offset voltage VOFSMAX, the test mode logic 114a expects to receive the output voltage VOUT in state because VREF=VM<VP=(VREF+VOFSMAX);
  g) after a delay, the swap control signal CTRL toggles to low, the test input voltage VINtest is coupled to the negative input VM and the reference voltage VREF is coupled to positive input VP;
  h) since comparator 113 offset is lower than VOFSMAX, the test mode logic 114a expects now to receive the output voltage VOUT in low state because VREF=VP<VM(VREF+VOFSMAX);

i) if the test mode logic 114a detects always the expected state of the output voltage VOUT, then the test is considered as pass, otherwise it is considered fail;

j) the test result is sent by the BIST module 114 to ATE 12 through the input/output pin IOPIN and the input/output interface 130.

In FIG. 11A it is shown a simple schematization where with the generator VOFS coupled to the inverting input VM is indicated not a real voltage source, but it represents the randomic offset of the comparator 113.

The swap control signal CTRL is one. the test input voltage VINtest is coupled to the positive input VP and is equal to VREF+VOFSMAX. For example, if expected maximum offset of comparator 113 is 3 mV, then test input voltage VINtest is chosen higher (i.e., VREF+4 mV) in order to guarantee that comparator offset is always lower than 4 mV.

In FIG. 11B it is shown the schematization of FIG. 11A regarding when the swap control signal CTRL changes from one to zero, high to low, like in step g). The coupling of the inputs VM, VP of the comparator 113 to VIntest and Vref is swapped to test the offset high to low HL. The randomic offset could be positive or negative, therefore it is important to swap the comparator inputs in order to verify that comparator offset ranges always between −VOFSMAX and +VOFSMAX.

In FIG. 11C it is shown the schematization of FIG. 11A regarding when the swap control signal CTRL changes from zero to one, low to high, like in step d). The coupling of the inputs VM, VP of the comparator 113 to test input voltage VINtest and reference voltage VREF is restored to test the offset low to high LH.

In FIG. 12A is shown a time diagram of test sequence with pass result, corresponding to the phase of FIG. 11A, i.e., the swap control signal CTRL is asserted to logic one. Output voltage VOUT, and the voltage VP and VM on the positive and negative inputs of the comparator 113 are shown as function of time t. The voltage levels corresponding to the test input voltage VINtest and reference voltage VREF At time t1 the test input voltage VINtest is coupled to the positive input VP of comparator 113. If the comparator state is the expected one, as shown, test result is pass.

In FIG. 12B is shown a time diagram of test sequence with pass result, corresponding to the phase of FIG. 11B, i.e., the swap control signal CTRL passes from high to low one to zero. At time t2 the inputs of comparator 113 are swapped to test high to low offset HL. If comparator correctly toggles, as shown, test result is pass.

In FIG. 12C is shown a time diagram of test sequence with pass result, corresponding to the phase of FIG. 11C, i.e., the swap control signal CTRL passes from low to high, zero to one. At time t2 the inputs of comparator 113 are restored to test low to high offset LH. If the comparator 113 toggles correctly, as shown, test result is pass.

Figures 13A, 13B, 13C:
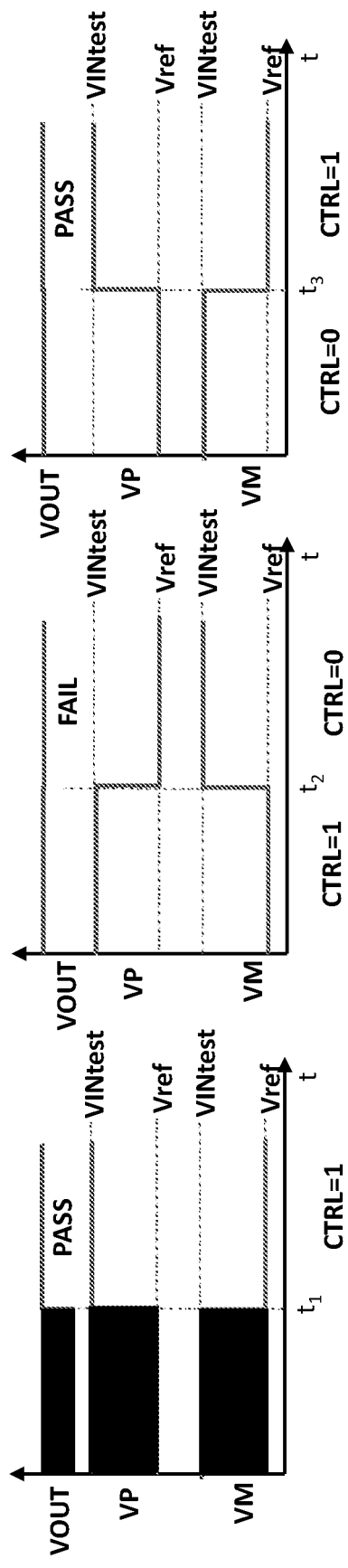

In FIGS. 13A, 13B, 13C are shown time diagrams for the same offset test phases of respectively FIGS. 12A, 12B, 12C, which gives a fail in the second phase, e.g., FIG. 13B.

In FIG. 13A, at time t1 the test input voltage VINtest is coupled to positive input of comparator 113 (voltage VP). If comparator 113 state Vout is the expected one, as shown, test result is pass.

In FIG. 13B, at time t2, the couplings of the comparator inputs VM, VP are swapped to test high to low offset HL. If the output VOUT of the comparator 113 does not toggle, as shown, test result is fail.

In FIG. 13C, at time t3, the input restored to test low to high offset LH. If the comparator output VOUT correctly toggles, as shown, test result is pass.

Once the reference voltage generator 112, the divider 111 ratio and the maximum offset of the comparator 113 have been measured, then it is possible to calculate the thresholds and hysteresis of the comparator 113.

The threshold is defined as the input voltage that forces the comparator 113 to toggle its output because the voltage VP on its positive input crosses the voltage VM on its negative input plus the offset. With reference to the schematics of architecture 20 in FIG. 7, the threshold is the value of the divided voltage $VIN_{RATIO}$ when it is equal to the reference VREF plus comparator offset VOFS.

$$VIN_{RATIO\_TH} = V_{REF} + V_{OFS}$$

The corresponding value of input voltage VIN from the voltage supply 126 is obtained by multiplying the divided voltage $VIN_{RATIO}$ with the divider ratio α:

$$VIN = VIN_{RATIO} * \alpha = VIN_{RATIO} * \frac{R_H + R_L}{R_L}$$

Since:

$$VIN_{RATIO} = \frac{VIN}{\alpha}$$

Then:

$$VIN_{TH} = \alpha * (V_{REF} + V_{OFS})$$

In the solution here described the comparator offset VOFS is not a measured value but a maximum value of offset, therefore thresholds and hysteresis are obtained by the following equations:

$$VIN_{TH_{LH}} = \alpha * (V_{REFLH} \pm V_{OFSMAX})$$

$$VIN_{TH_{HL}} = \alpha * (V_{REFHL} \pm V_{OFSMAX})$$

$$VIN_{TH\ HYST} = \alpha * (V_{REFLH} - V_{REFHL} \pm V_{OFSMAX})$$

Figure 14:
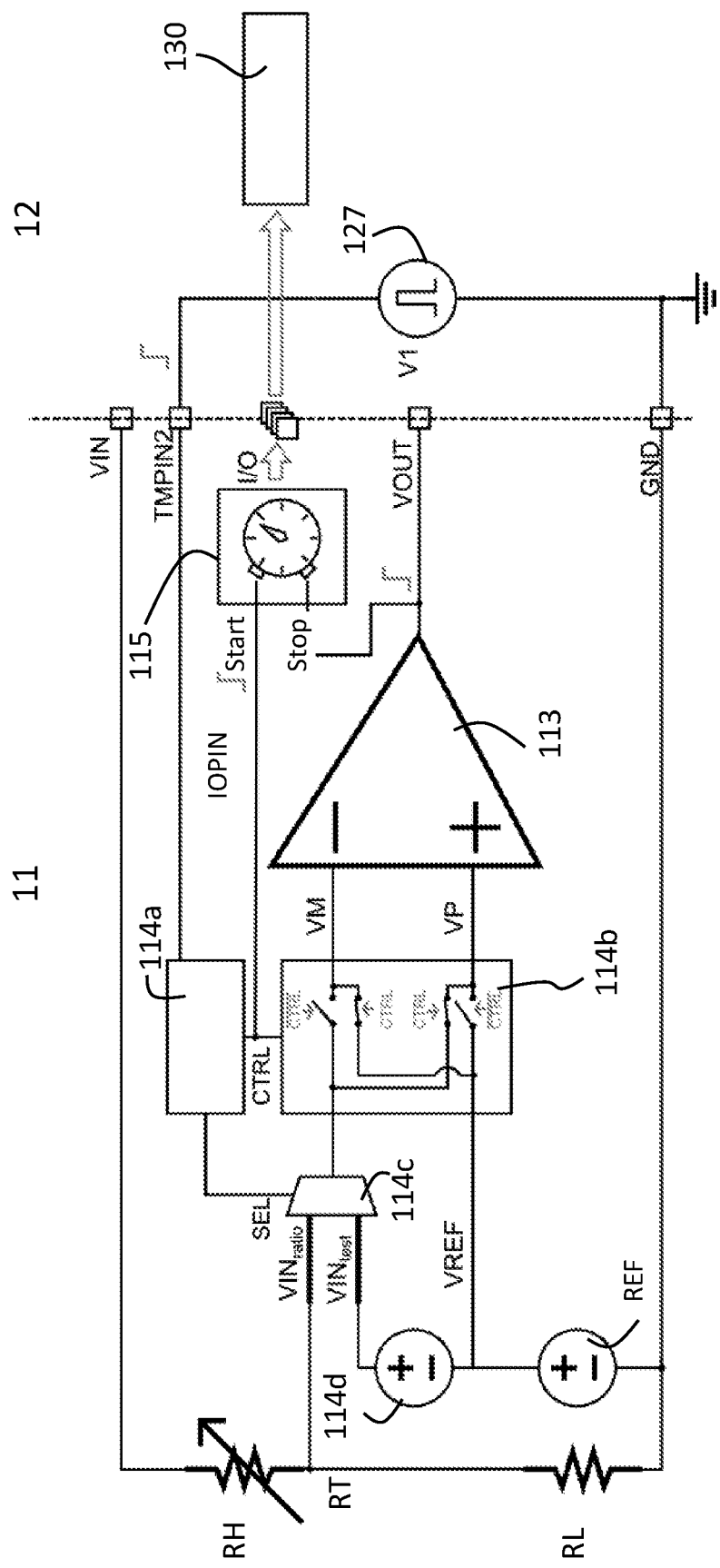
FIG. 14 shows implementing details of the system of FIG. 7 in a further configuration of operation.

In FIG. 14 a possible implementation of the architecture 20 for performing the reaction test is shown. The arrangement corresponds to that of FIG. 10, with the same components, however a further counter 115 is added receiving as start signal the swap control signal CTRL and as stop signal the output voltage VOUT, in particular their logic transitions in both directions, in particular their rising edges or falling edges are used as start and stop signal. The pass or fail result is sent as digital value through the input/output IOPIN to the input/output interface 130.

The reaction time test it thus performed by the BIST module 114, and comprises:

a) ATE 12 couples all the relevant modules, to the corresponding pins of electronic circuit 11, in particular at least the signal generator 127 and the input output interface 130;

b) the signal generator 127 generates a pulse on the second test input TMPIN2 to start the test;

c) the testmode logic 114a controls the state of signals SEL, CTRL and reads the state VOUT of the comparator 113;

d) the selection SEL is set by the test mode logic 114a so that the test input voltage VINtest, equal to VREF+VOFSMAX and created internally in the circuit 11 is brought at the inverting input VM of the comparator 113 when control signal CTRL is low;

e) the counter 115 is reset and set ready to start, having as start signal the swap control signal CTRL and as stop signal the output voltage VOUT;

f) the swap control signal CTRL goes from low to high (starting counter 115) and the output voltage VOUT changes its state after a delay (stopping counter 115);

g) the reaction time low to high $D_{LH}$ is measured as propagation delay between the swap control signal CTRL toggle low to high and the output voltage VOUT toggle low to high;

h) the measured value of reaction time low to high $D_{LH}$ is saved, in the BIST module 114, the counter 115 is reset and ready to start;

i) the swap control signal CTRL goes from high to low (starting counter 115) and the output voltage VOUT changes its state after a delay (stopping counter 115);

j) the reaction time high to low $D_{HL}$ is measured as propagation delay between the swap control signal CTRL toggling high to low and the output voltage VOUT toggling high to low;

k) the measured value of reaction time high to low $D_{HL}$ is saved, in the BIST module 114;

l) the BIST module 114 evaluates the stored value of reaction time low to high $D_{LH}$ and reaction time high to low $D_{HL}$ with pass/fail criteria;

m) Test result, e.g., pass or fail is sent as digital value through the input/out pint IOPIN to the input/output interface 130.

Figures 15A, 15B, 15C:
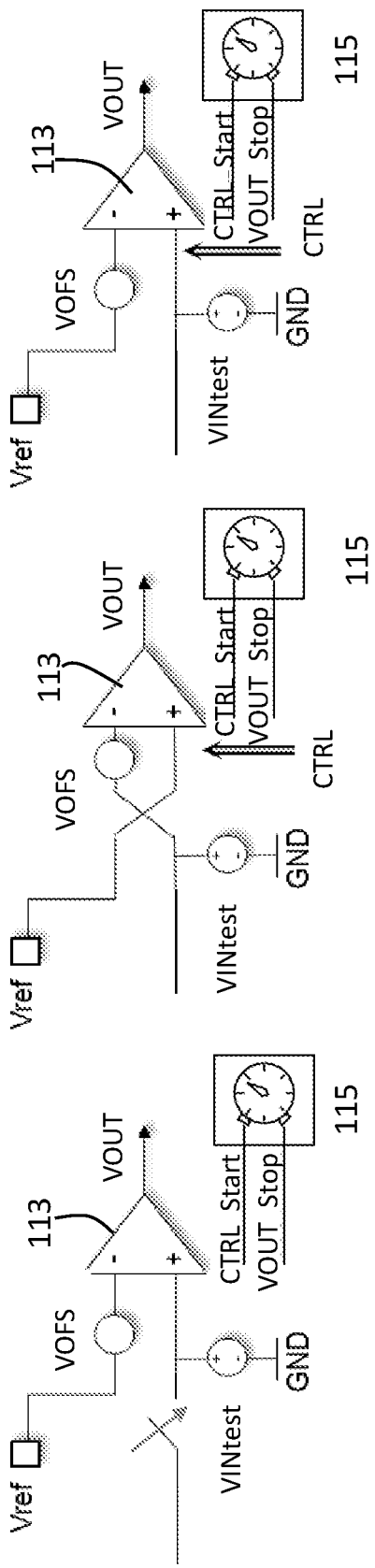

In FIG. 15A, 15B, 15C are shown simplified schematizations of the circuit of FIG. 14 representing phases of the reaction time test sequence.

It is underlined that the architecture of FIG. 14 is the same of FIG. 10 with the counter 115 added therefore it can perform also the offset test. Since, as just shown, the reaction time test has the same sequence of the offset test, in particular regarding the CTRL, SEL and, consequently, VOUT signals, therefore with one test it is possible to perform both reaction time and offset measure.

As shown FIGS. 15A, 15B, 15C corresponds to FIG. 11A, 11B, 11C respectively, representing the same phase only with the addition counter 115 which is coupled to swap control signal CTRL and output voltage VOUT.

In FIG. 15A, the swap control signal CTRL is one or high, test input voltage VINtest is coupled to positive input of comparator 113. Counter 115 is reset and ready to start.

In FIG. 15B, the swap control signal CTRL goes low, the comparator input is swapped to test reaction time high to low $D_{HL}$. Counter 115 measures the delay between CTRL falling edge and VOUT falling edge. The measured value is stored in the test mode logic 114a.

In FIG. 15C the swap control signal CTRL goes high, the comparator input is restored to test reaction time low to high $D_{LH}$. Counter 115 measures the delay between CTRL rising edge and VOUT rising edge. The measured value is stored in the test mode logic 114a.

In FIG. 16A and 16B are shown time diagram of test sequence with pass or fail result. The control signal CTRL, the voltage output VOUT, a count $C_{115}$ of the counter 115 and a configured threshold $TH_{115}$ of the counter 115 are shown as a function of time t.

In FIG. 16A the reaction times $D_{HL}$, $D_{LH}$ measured by the counter 115 are lower than such configured threshold $TH_{115}$, it means that comparator 113 is fast and test is considered a pass.

In FIG. 16B the reaction times $D_{HL}$, $D_{LH}$ measured by the counter are higher than such configured threshold $TH_{115}$, it means that comparator 113 is too slow and test is considered as a fail.

The described solution thus has several advantages with respect to the prior art solutions.

Thus, advantageously, the method and architecture for testing here described reduce test time related cost by replacing the applicative step test and double ramp test of a voltage monitor with two voltage measurements and one built-in self-test based on input/output communication interfaces.

The solution described involves cost saving at ATE level. Threshold measurements with voltage meters approach plus offset BIST measure requires less time respect to known solution double ramp approach. For example, typical values for test duration are T(voltagemeter)=1 ms, T(bist offset)=0.1 ms and T(voltage ramp)=5 ms. Also the BIST for comparator reaction time avoids connection/disconnection of ATE TMU that typically requires t(TMU CONN/DISC)=6 ms.

Since the electronic circuit, in particular an integrated circuit, contains several voltage monitor with configurable thresholds, the test time saving of this measure has a huge impact on total integrated circuit test time. Test time may be reduced, for instance by a factor eight.

In terms of test program issue, the advantage is the reduction of test program repeatability and test setup issue, since both offset and reaction time are measured inside the integrated circuit without the impact of ATE equipment.

Of course, without prejudice to the principle of the disclosure, the details of construction and the embodiments may vary widely with respect to what has been described and illustrated herein purely by way of example, without thereby departing from the scope of the present disclosure, as defined by the ensuing claims.

A system for testing may be summarized as including an electronic circuit to be tested (11) and an automatic testing equipment (12), said electronic circuit (11) to be tested including a voltage monitor (110) to be tested including a resistive divider (111) receiving at its voltage input an input voltage (VIN) to be monitored and coupled at its output to an input of a comparator (113), a reference input of said comparator (113) being coupled to a reference voltage generator (112) supplying a reference voltage (VREF) setting one or more thresholds of the comparator (113), wherein said electronic circuit (11) to be tested includes a Built In Self Test Module (114) coupled to said Automatic Test Equipment (12) and to the inputs and output of said comparator (113), said BIST module (114) being configured upon receiving respective commands from the Automatic Test Equipment (12) to test a reaction time ($D_{LH}$, $D_{HL}$) of the comparator (113) and an offset (VOFS) of the comparator (113), said Automatic Test Equipment (12) including means (125, 126, 127, 128, 129) for performing a respective test of the ratio of the resistor divider (111) by a first voltage measurement (128) of a voltage between an input of the divider (111) and the output of the divider (111) and a test of the reference voltage (VREF) provided by the reference threshold generator (112) by a second voltage measurement (129) of the voltage applied by the reference threshold generator (112) at the reference input node of the comparator (113).

Said Built In Self Test Module (114) may include a logic module (114a) configured to issue command signals (CTRL, SEL) upon reception of said enabling signal, a swap circuit (114b) may include two inputs and two outputs and an arrangement of switches configured to swap the coupling between its two outputs and its two inputs, at the outputs of said swap circuit (114b) being coupled the inputs of said comparator (113), at the inputs of said swap circuit (114b) being coupled the output of said divider (111) and said reference threshold generator (112), the output of said divider (111) being coupled through a selection circuit (114c), coupled at another its input to an offset generator (114d) coupled in series with the reference threshold generator (112) and the reference input of the comparator (113), to said input of the swap circuit (114b).

The Automatic Test Equipment (12) may include a first voltmeter (128) selectively connectable between the input of the divider (111) and the output of the divider (111) coupled to the voltage input of the comparator (113) and a voltage generator (125) connectable to the input of the divider (111), and a second voltmeter (129) selectively connectable at the reference input node of the comparator (113) between the reference input of the comparator (113) and ground.

The BIST module (114) may include a counter (115) for measuring the reaction time, which start and stop signal input are coupled to the input and output of the comparator (113).

Said Automatic Test Equipment (12) may include also a signal generator (127) coupled to said a Built In Self Test Module (114) to send a signal enabling said Built In Self Test Module (114) to perform said reaction time test and said comparator offset test.

An electronic circuit to be tested may be configured to operate in the system.

A method for testing an electronic circuit to be tested (11) using a system, may be summarized as including performing a test of a reaction time ($D_{LH}$, $D_{HL}$) of the comparator (113) and an offset (VOFS) of the comparator (113) by the Built In Self Test Module (114) coupled to said Automatic Test Equipment (12) and to the inputs and output of said comparator (113), said BIST module (114) being configured upon receiving respective commands from the Automatic Test Equipment (12), performing by said Automatic Test Equipment (12) a respective test of the ratio of the resistor divider (111) by a first voltage measurement of a voltage between an input of the divider (111) and the output of the divider (111) and a test of the reference voltage (VREF) provided by the reference threshold generator (112) by a second voltage measurement of the voltage applied by the reference threshold generator (112) at the reference input node of the comparator (113).

Said test of the reference threshold generator (112) may include the following steps: a) coupling the second voltage meter (129) at the reference input node of the comparator (113); b) closing a test mode switch (TM2) coupling the reference voltage (VREF) to a test output (TMPIN3) of the electronic circuit (11) to which the second voltage meter (129);

c) reading by the second voltage meter (129) the reference voltage (VREF) value.

Said test of the resistor divider (111) may include the following these steps: coupling the voltage generator (126) to the divider input at the first voltmeter (128) between the input of the divider (111) and the output of the divider (111); supplying by the voltage supply generator (126) an input voltage to the divider (111) input; closing a test mode switch (TM1) to couple the output node of the divider (111) to the voltage supply generator (126); reading by the second voltage meter (129) reading the difference between the input voltage (VIN) and the voltage value on the output node of the divider (111); calculating a resistor divider ratio as the ratio (a) of the input voltage (VIN) to the voltage value on the output node of the divider (111).

Said test of the offset of the comparator (113) performs the following steps: coupling the signal generator (127) to an input of a test mode logic module (114a) of the Built In Self Test module (114) and an output a logic module (114a) of the Built In Self Test module (114) to an input/output interface (130); generating by the signal generator (127) a pulse to enable the start of Built In Self Test module (114); setting a selection signal (SEL) of the selection circuit (114c) by the test mode logic (114) so that a test input voltage (VINtest), sum of the reference voltage (VREF) and of the offset voltage (VOFSMAX) is brought at the voltage input (VM) of the comparator 113 and changing a swap control signal (CTRL) from low to high logic level, so that said test input voltage (VINtest) is coupled to the voltage input (VP) and the reference voltage (VREF) is coupled to the reference input (VM) of the comparator (113); checking if the output voltage (VOUT) is in high state, in affirmative the offset comparator being evaluated as lower than the offset voltage (VOFSMAX); after a delay, changing the swap control signal (CTRL) to low level to couple the test input voltage (VINtest) is coupled to the reference input (VM) and the reference voltage (VREF) to the input voltage (VP); checking if the output voltage (VOUT) is in low state, in affirmative the offset comparator being evaluated as lower than the offset voltage (VOFSMAX); determining the test result as passed if all the checks are affirmative, otherwise considering the test as failed; sending the test result by the BIST module (114) to the ATE (12) through the input/output interface (130).

Said test of the reaction time of the comparator (113) performs the following steps: coupling the signal generator (127) to an input of a test mode logic module (114a) of the Built In Self Test module (114) and an output a logic module (114a) of the Built In Self Test module (114) to an input/output interface (130); generating by the signal generator (127) a pulse to enable the start of the Built In Self Test module (114); setting a selection signal (SEL) of the selection circuit (114c) by the test mode logic (114) so that a test input voltage (VINtest), sum of the reference voltage (VREF) and of the offset voltage (VOFSMAX) is brought at the voltage input (VM) of the comparator 113; resetting the counter (115), which receives the control signal (CTRL) as start signal and the output voltage (VOUT) as stop signal of the count operation; setting the swap control signal (CTRL) from low to high level, starting the count in the counter (115) and determining the output voltage (VOUT) to change its state after a propagation delay reaction time, stopping the count of counter (115); measuring a reaction time low to high ($D_{LH}$) as propagation delay between the swap control signal (CTRL) changing from low to high level and the output voltage (VOUT) changing its output state accordingly; saving the measured value of reaction time low to high ($D_{LH}$) in the BIST module 114, resetting the counter (115); setting the swap control signal (CTRL) from high to low level, starting the count in the counter (115) and determining the output voltage (VOUT) to change its state after a propagation delay reaction time, stopping the count of counter (115); measuring a reaction time high to low ($D_{HL}$) as propagation delay between the swap control signal (CTRL) changing from high to low level and the output voltage (VOUT) changing its output state accordingly; saving the measured value of reaction time high to low ($D_{HL}$) in the BIST module (114); evaluating at the BIST module (114) said reaction time saved values ($D_{LH}$, $D_{HL}$) with respect to pass/fail criteria, producing a test result indicating a pass or a fail; sending the test result through the input/output interface (130) to the Automatic Test Equipment (12).

A computer program product that can be loaded into the memory of at least one computer and may be summarized as including parts of software code that are able to execute the steps of the method when the product is run on at least one computer.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A system, comprising:
    automatic test equipment; and
    an electronic circuit to be tested including:
    a voltage monitor including:
    a comparator having:
    a voltage input;
    a reference input coupled to a reference voltage generator configured to supply a reference voltage for setting one or more thresholds of the comparator; and
    an output;
    a resistive divider having a voltage input and an output, the resistive divider being configured to receive an input voltage over the voltage input, the output of the resistive divider being coupled to the voltage input of the comparator; and
    a built-in self-test circuit coupled to the automatic test equipment and to the voltage and reference inputs and output of the comparator, the built-in self-test circuit being configured to:
    receive first and second commands from the automatic test equipment,
    in response to receiving the first command, test a reaction time of the comparator, and
    in response to receiving the second command, test and an offset of the comparator,
    wherein the automatic test equipment is configured to:
    test a ratio of the resistive divider by performing a first voltage measurement of a voltage between the voltage input of the resistive divider and the output of the resistive divider; and
    test of the reference voltage provided by the reference voltage generator by performing a second voltage measurement of the reference voltage provided by the reference voltage generator at the reference input of the comparator.

2. The system according to claim 1, wherein the built-in self-test circuit includes:
    a logic circuit configured to:
      receive an enabling signal; and
      in response to receiving the enabling signal, issue command signals; and
    a swap circuit including:
      first and second inputs respectively coupled to the output of the resistive divider and the reference voltage generator;
      first and second outputs respectively coupled to the voltage and reference inputs of the comparator; and
      an arrangement of switches configured to swap a coupling between the first and second outputs and the first and second inputs of the swap circuit.

3. The system according to claim 2, wherein the built-in self-test circuit includes:
    a selection circuit having a first data input coupled to the output of the resistive divider, a second data input coupled to an output of an offset generator and an output coupled to the first input of the swap circuit, wherein the offset generator is coupled in series with the reference voltage generator.

4. The system according to claim 1, wherein the automatic test equipment includes:
    a first voltmeter selectively connectable between the voltage input of the resistive divider and the output of the resistive divider, wherein the resistive divider receives the input voltage from a voltage generator connectable to the voltage input of the resistive divider, and
    a second voltmeter selectively connectable at the reference input of the comparator between the reference input of the comparator and ground.

5. The system according to claim 1, wherein the built-in self-test circuit includes: a counter having a start signal input coupled to the voltage input of the comparator and a stop signal input coupled to the output of the comparator and configured to measure the reaction time of the comparator.

6. The system according to claim 1, wherein the automatic test equipment includes: a signal generator coupled to the built-in self-test circuit and configured to output a signal enabling the built-in self-test circuit to test the reaction time of the comparator and test the offset of the comparator.

7. A method for testing an electronic circuit to be tested, comprising:
    performing, by a built-in self-test circuit, a test of a reaction time of a comparator and an offset of the comparator, the built-in self-test circuit being coupled to an automatic test equipment and to a reference input, a voltage input and an output of the comparator;
    receiving, by the built-in self-test circuit, first and second commands from the automatic test equipment;
    in response to receiving the first command, performing by the automatic test equipment a test of a ratio of a resistive divider, wherein performing the test of the ratio of the resistive divider includes determining a first voltage measurement of a voltage between the voltage input of the resistive divider and the output of the resistive divider; and
    in response to receiving the second command, performing by the automatic test equipment a test of a reference voltage provided by a reference voltage generator, wherein performing the test of the reference voltage includes determining a second voltage measurement of the reference voltage provided by the reference voltage generator to the reference input of the comparator.

8. The method according to claim 7, wherein performing the test of the reference voltage includes:
    coupling a voltmeter to the reference input of the comparator;
    closing a test mode switch coupling the reference input to a test output of an electronic circuit of the voltmeter; and
    reading a reference voltage value of the voltmeter.

9. The method according to claim 7, wherein performing the test of the ratio of the resistive divider includes:

coupling a voltage generator to the voltage input of the resistive divider and coupling a first voltmeter between the voltage input of the resistive divider and the output of the resistive divider;

supplying by the voltage generator an input voltage to the voltage input of the resistive divider;

closing a test mode switch to couple the output of the resistive divider to the voltage generator;

reading by a second voltage meter a difference between an input voltage and a voltage value at the output of the resistive divider; and determining the ratio of the resistive divider as a ratio of the input voltage to the voltage value.

10. The method according to claim 7 wherein performing the test of the offset of the comparator includes:

coupling a signal generator to an input of a test mode logic circuit of the built-in self-test circuit and coupling an output of the test mode logic circuit to an input or output interface;

generating by the signal generator a pulse to enable a start of the built-in self-test circuit; and setting a selection signal of a selection circuit by the test mode logic circuit, wherein the selection circuit has a first data input coupled to the output of the resistive divider, a second data input coupled to an output of an offset generator and an output coupled to a first input of a swap circuit.

11. The method according to claim 10, wherein the selection signal is set such that a test input voltage that is a sum of the reference voltage and an offset voltage of the offset generator is provided to the voltage input of the comparator.

12. The method according to claim 11, wherein performing the test of the offset of the comparator includes:

changing a swap control signal from a low logic level to a high logic level, so that the test input voltage is coupled to the voltage input and the reference voltage is coupled to the reference input of the comparator;

determining whether the output voltage of the comparator is in a high state;

after a delay, changing the swap control signal to the low logic level to couple the test input voltage to the reference input and the reference voltage to the input voltage; and determining whether the output voltage is in a low state.

13. The method according to claim 12, wherein performing the test of the offset of the comparator includes:

in response to determining that the output voltage is in a high state when the swap control signal has the high logic level and determining that the output voltage is in the low state when the swap control signal has the low logic level, determining that a result of the test of the offset of the comparator is a pass.

14. The method according to claim 13, wherein performing the test of the offset of the comparator includes:

sending the result of the test to the automatic test equipment.

15. The method according to claim 12, wherein performing the test of the offset of the comparator includes:

in response to determining that the output voltage is in the low state when the swap control signal has the high logic level or determining that the output voltage is in the high state when the swap control signal has the low logic level, determining that a result the test of the offset of the comparator is a fail.

16. The method according to claim 15, wherein performing the test of the offset of the comparator includes:

sending the result of the test to the automatic test equipment.

17. The method according to claim 7, wherein performing the test of the reaction time of the comparator includes:

coupling a signal generator to an input of a test mode logic circuit of the built-in self-test circuit and coupling an output of the test mode logic circuit to an input or output interface;

generating by the signal generator a pulse to enable a start of the built-in self-test circuit;

setting a selection signal of a selection circuit by the test mode logic circuit, wherein the selection circuit has a first data input coupled to the output of the resistive divider, a second data input coupled to an output of an offset generator and an output coupled to a first input of a swap circuit, and wherein the selection signal is set such that a test input voltage that is a sum of the reference voltage and an offset voltage of the offset generator is provided to the voltage input of the comparator;

resetting a counter, wherein the counter is configured to receive a swap control signal as a start signal and an output voltage of the comparator as stop signal of a count operation;

setting the swap control signal from a low logic level to a high logic level;

starting a count in the counter;

determining that the output voltage changed states after a first propagation delay reaction time;

stopping the count of the counter;

determining a low-to-high reaction time as a propagation delay between the swap control signal changing from the low logic level to the high logic level and the output voltage changing states;

saving the low-to-high reaction time;

resetting the counter;

setting the swap control signal from the high logic level to the low logic level;

starting the count in the counter;

determining that the output voltage changed states after a second propagation delay reaction time;

stopping the count of the counter;

determining a high-to-low reaction time as a propagation delay between the swap control signal changing from the high logic level to the low logic level and the output voltage changing states;

saving the high-to-low reaction time;

evaluating, by the built-in self-test circuit, the low-to-high reaction time and the high-to-low reaction time;

determining whether the test of the reaction time is a pass or a fail based on evaluating the low-to-high reaction time and the high-to-low reaction time; and sending a result of the test to the automatic test equipment.

18. A non-transitory computer-readable storage medium having stored thereon executable instructions that, when executed by a processor, cause the processor to:

perform a test of a reaction time of a comparator and an offset of the comparator, wherein a built-in self-test circuit is coupled to an automatic test equipment and to a reference input, a voltage input and an output of the comparator;

receive first and second commands from the automatic test equipment;

in response to receiving the first command, perform a test of a ratio of a resistive divider, wherein performing the test of the ratio of the resistive divider includes determining a first voltage measurement of a voltage between the voltage input of the resistive divider and the output of the resistive divider; and in response to receiving the second command, perform a test of a reference voltage provided by a reference voltage generator, wherein performing the test of the reference voltage includes determining a second voltage measurement of the reference voltage provided by the reference voltage generator to the reference input of the comparator.

19. The non-transitory computer-readable storage medium according to claim 18, wherein the executable instructions cause the processor to: measure the reaction time based on the voltage input and an output of the comparator.

20. The non-transitory computer-readable storage medium according to claim 18, wherein the executable instructions cause the processor to: output a signal enabling the test of the reaction time of the comparator and the test of the offset of the comparator.

* * * * *

UNITED STATES PATENT AND TRADEMARK OFFICE
CERTIFICATE OF CORRECTION

| | | |
|---|---|---|
| PATENT NO. | : 12,163,997 B2 | Page 1 of 1 |
| APPLICATION NO. | : 18/151330 | |
| DATED | : December 10, 2024 | |
| INVENTOR(S) | : Nicola De Campo et al. | |

It is certified that error appears in the above-identified patent and that said Letters Patent is hereby corrected as shown below:

In the Claims

<u>Column 17, Claim 1, Line 44:</u>
"test and an" should read: --test an--.

Signed and Sealed this
Eleventh Day of February, 2025

Coke Morgan Stewart
*Acting Director of the United States Patent and Trademark Office*